US007982908B2

(12) United States Patent
Kita et al.

(10) Patent No.: US 7,982,908 B2
(45) Date of Patent: Jul. 19, 2011

(54) COLOR IMAGE FORMING APPARATUS AND CONTROL METHOD THEREFOR

(75) Inventors: Hiroshi Kita, Numazu (JP); Hiroki Tezuka, Tokyo (JP); Yoichicro Maebashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 885 days.

(21) Appl. No.: 11/113,986

(22) Filed: Apr. 26, 2005

(65) Prior Publication Data

US 2005/0248789 A1 Nov. 10, 2005

(30) Foreign Application Priority Data

May 7, 2004 (JP) ................................ 2004-139095

(51) Int. Cl.
*G06F 15/00* (2006.01)
*G03G 15/00* (2006.01)
*G03F 3/08* (2006.01)

(52) U.S. Cl. ......... 358/1.9; 358/520; 358/521; 358/518; 399/49; 399/72

(58) Field of Classification Search ........................ None
See application file for complete search history.

(56) References Cited

U.S. PATENT DOCUMENTS

| | | | | |
|---|---|---|---|---|
| 5,450,165 | A | 9/1995 | Henderson | 399/49 |
| 5,887,223 | A * | 3/1999 | Sakai et al. | 399/60 |
| 6,031,629 | A | 2/2000 | Shibuya et al. | |
| 6,070,022 | A | 5/2000 | Kobayashi et al. | 399/12 |
| 6,243,542 | B1 | 6/2001 | Fujimoto et al. | 399/49 |
| 6,450,606 | B1 * | 9/2002 | Kato et al. | 347/19 |
| 6,693,654 | B2 | 2/2004 | Shinohara | 347/116 |
| 6,731,889 | B2 | 5/2004 | Nakayama | 477/181 |
| 6,853,815 | B2 | 2/2005 | Tezuka et al. | 399/39 |
| 6,898,381 | B2 | 5/2005 | Maebashi et al. | 399/15 |
| 6,985,678 | B2 | 1/2006 | Maebashi et al. | |
| 7,097,270 | B2 | 8/2006 | Yamazaki | 347/19 |
| 7,151,248 | B2 | 12/2006 | Harush et al. | 250/221 |
| 7,206,068 | B2 | 4/2007 | Suzuki | 356/244 |
| 7,280,778 | B2 | 10/2007 | Maebashi et al. | 399/49 |
| 2002/0181964 | A1 | 12/2002 | Campbell et al. | 399/49 |
| 2003/0049040 | A1 * | 3/2003 | Tezuka et al. | 399/49 |

(Continued)

FOREIGN PATENT DOCUMENTS

CN 1410841 4/2003

(Continued)

OTHER PUBLICATIONS

Office Action dated Nov. 30, 2009 in JP 2004-139095.

*Primary Examiner* — Twyler Haskins
*Assistant Examiner* — Barbara Reinier
(74) *Attorney, Agent, or Firm* — Fitzpatrick, Cella, Harper & Scinto

(57) ABSTRACT

Patches of black and a mixture of color coloring materials are formed on a recording medium, and the chromaticities of the patches are detected (S11). Black tonality data serving as reference lightnesses corresponding to respective tonality data are acquired from pieces of lightness information contained in the detected chromaticities corresponding to the respective tonalities of the black patches. Pieces of black lightness information are corrected on the basis of the acquired black tonality data and the detection results of the black patches. Chromaticities corresponding to the black tonality data are defined as target chromaticities, and the mixture rates of the color coloring materials are corrected on the basis of the target chromaticities and the chromaticities obtained by detecting the patches using the color coloring materials.

8 Claims, 14 Drawing Sheets

U.S. PATENT DOCUMENTS

| | | | | |
|---|---|---|---|---|
| 2003/0085941 | A1* | 5/2003 | Tezuka et al. | 347/19 |
| 2003/0090693 | A1 | 5/2003 | Tezuka et al. | 358/1.9 |
| 2003/0138261 | A1 | 7/2003 | Tezuka et al. | 399/49 |
| 2004/0042807 | A1 | 3/2004 | Nakayama | 399/49 |
| 2004/0062560 | A1 | 4/2004 | Mochizuki et al. | 399/49 |
| 2004/0081477 | A1* | 4/2004 | Maebashi et al. | 399/49 |
| 2004/0096231 | A1 | 5/2004 | Furno et al. | 399/49 |
| 2004/0136739 | A1 | 7/2004 | Nakamura et al. | 399/49 |
| 2004/0208662 | A1 | 10/2004 | Ichikawa et al. | 399/49 |
| 2005/0088672 | A1 | 4/2005 | Johnson | |
| 2005/0211902 | A1 | 9/2005 | Barry et al. | 250/341.1 |
| 2005/0260003 | A1 | 11/2005 | Tezuka | 399/15 |
| 2005/0260004 | A1 | 11/2005 | Maebashi et al. | 399/15 |
| 2006/0023272 | A1 | 2/2006 | Tezuka | 358/518 |

FOREIGN PATENT DOCUMENTS

| | | | |
|---|---|---|---|
| CN | 1417650 | A | 5/2003 |
| EP | 1 152 598 | A2 | 11/2001 |
| EP | 1 291 731 | A1 | 3/2003 |
| EP | 1 298 500 | A2 | 4/2003 |
| EP | 1 310 832 | A | 5/2003 |
| JP | 07-055703 | | 3/1995 |
| JP | 10-193688 | | 7/1998 |
| JP | 11-119481 | | 4/1999 |
| JP | 11-136532 | A | 5/1999 |
| JP | 3430702 | | 5/2002 |
| JP | 2003-084532 | | 3/2003 |
| JP | 2003-107835 | | 4/2003 |
| JP | 2003-150006 | | 5/2003 |
| JP | 2003-287934 | | 10/2003 |
| JP | 2004-101911 | | 4/2004 |

* cited by examiner

FIG. 7

| PATCH NO. | C TONALITY DATA | M TONALITY DATA | Y TONALITY DATA | K TONALITY DATA |
|---|---|---|---|---|
| 0-0 | C1 | M1 | Y1 | 0 |
| 0-1 | C1-α | M1 | Y1 | 0 |
| 0-2 | C1+α | M1 | Y1 | 0 |
| 0-3 | C1 | M1-α | Y1 | 0 |
| 0-4 | C1 | M1+α | Y1 | 0 |
| 0-5 | C1 | M1 | Y1-α | 0 |
| 0-6 | C1 | M1 | Y1+α | 0 |
| 0-K0 | 0 | 0 | 0 | K0 |
| 0-K1 | 0 | 0 | 0 | K1 |
| 0-K2 | 0 | 0 | 0 | K2 |
| 0-K3 | 0 | 0 | 0 | K3 |
| 0-K4 | 0 | 0 | 0 | K4 |
| 0-K5 | 0 | 0 | 0 | K5 |
| 0-K6 | 0 | 0 | 0 | K6 |
| 0-K7 | 0 | 0 | 0 | K7 |

FIG. 12

| PATCH NO. | C TONALITY DATA | M TONALITY DATA | Y TONALITY DATA | K TONALITY DATA |
|---|---|---|---|---|
| 0-0 | C0 | M0 | Y0 | 0 |
| 0-1 | C0-α | M0 | Y0 | 0 |
| 0-2 | C0+α | M0 | Y0 | 0 |
| 0-3 | C0 | M0-α | Y0 | 0 |
| 0-4 | C0 | M0+α | Y0 | 0 |
| 0-5 | C0 | M0 | Y0-α | 0 |
| 0-6 | C0 | M0 | Y0+α | 0 |
| 0-7 | 0 | 0 | 0 | K0 |
| 1-0 | C1 | M1 | Y1 | 0 |
| 1-1 | C1-α | M1 | Y1 | 0 |
| 1-2 | C1+α | M1 | Y1 | 0 |
| 1-3 | C1 | M1-α | Y1 | 0 |
| 1-4 | C1 | M1+α | Y1 | 0 |
| 1-5 | C1 | M1 | Y1-α | 0 |
| 1-6 | C1 | M1 | Y1+α | 0 |
| 1-7 | 0 | 0 | 0 | K1 |
| ⋮ | | | | |
| 7-0 | C7 | M7 | Y7 | 0 |
| 7-1 | C7-α | M7 | Y7 | 0 |
| 7-2 | C7+α | M7 | Y7 | 0 |
| 7-3 | C7 | M7-α | Y7 | 0 |
| 7-4 | C7 | M7+α | Y7 | 0 |
| 7-5 | C7 | M7 | Y7-α | 0 |
| 7-6 | C7 | M7 | Y7+α | 0 |
| 7-7 | 0 | 0 | 0 | K7 |

COLOR IMAGE FORMING APPARATUS AND CONTROL METHOD THEREFOR

FIELD OF THE INVENTION

The present invention relates to a color image forming apparatus of forming a color image on a recording medium by using a plurality of coloring materials, and a control method therefor.

BACKGROUND OF THE INVENTION

Recently, color image forming apparatuses adopting electrophotography, inkjet printing, and the like require higher resolution and higher image quality. In particular, the tonality of a formed color image and the stability of density in a formed image greatly influence the image forming characteristics of the color image forming apparatus. It is known that the density of an image formed by the color image forming apparatus varies upon a change in environment or long-time use. Especially an electrophotographic color image forming apparatus loses the color balance of a formed image upon even small density variations, and efforts must be made to always keep its density characteristics to tonality constant. For this purpose, the color image forming apparatus comprises a tonality correction means (e.g., look-up table: LUT) for correcting, for toner of each color, image data and process conditions such as several luminous exposures and several bias voltages for development in accordance with different absolute temperatures and humidities. The color image forming apparatus selects process conditions optimal for the environment and the optimal value of tonality correction on the basis of an absolute temperature/humidity measured by a temperature/humidity sensor.

In order to obtain constant density characteristics to tonality even upon variations in the characteristics of each part of the apparatus, the following density control is performed. First, a patch image for detecting density is formed on an intermediate transfer material, photosensitive drum, or the like with toner of each color. Then, the density of the unfixed toner image is optically detected by a density detection sensor. Process conditions such as the luminous exposure and the bias voltage for development are determined on the basis of the detection result (see Japanese Patent No. 3,430,702).

In density control (to be referred to as single-color control hereinafter) using the density detection sensor, a patch image is formed on an intermediate transfer material, photosensitive drum, or the like, and the density of the patch image is detected, but a change in the color balance of an image obtained by subsequently transferring and fixing a toner image onto a transfer material is not detected. The color balance changes depending on the transfer efficiency of transferring a toner image onto a transfer material and the heating and press for fixing. Such change cannot be dealt with by the above-mentioned density control using the density detection sensor for detecting the density of unfixed toner.

To solve this problem, the following color image forming apparatus has been proposed. A density or chromaticity detection sensor (to be referred to as a color sensor hereinafter) for detecting the density of a single toner image on a transfer material (sheet) or the chromaticity of a full-color image after transferring and fixing the toner image onto the transfer material is arranged on the downstream side of a fixing unit. An output from the color sensor is fed back to, e.g., a look-up table (LUT) for correcting image data and process conditions such as the luminous exposure and the bias voltage for development, and the density or chromaticity of an image formed on a transfer material is controlled. The color sensor uses light sources for emitting red (R), green (G), and blue (B) beams as light emitting devices in order to identify C, M, Y, and K colors and detect the density or chromaticity. Alternatively, the color sensor uses a light source for emitting a white (W) beam as a light emitting device, and three types of filters having different spectrum transmittances for red (R), green (G), blue (B), and the like are formed on a light sensor. By three outputs, e.g., R, G, and B outputs from the color sensor, C, M, Y, and K signals are generated and the density of an image can be detected. The chromaticity of an image can be detected by performing a mathematical process such as linear transform for R, G, and B outputs or conversion on the basis of the look-up table (LUT).

Various methods have conventionally been proposed for controlling the density or chromaticity of a formed image. For example, the following method has been proposed as a prior art of changing the gamma conversion characteristic on the basis of a density obtained by measuring a formed image, or correcting a color matching table or color separation table on the basis of a measured chromaticity. This method detects the chromaticities of a black single-color tone patch and CMY mixed-color tone patch on a transfer material by using a color sensor for detecting the chromaticity of a transfer material and that of a patch formed on the transfer material. The chromaticities of these two tone patches are compared, and when they coincide with each other, it is determined that the CMY mixed-color tone patch is achromatic and the lightness of the CMY mixed-color tone patch is equal to that of the black single-color tone patch (see Japanese Patent Laid-Open No. 2003-084532). Further, a color image forming apparatus has been proposed which calculates from the color identification result the mixture rate at which a CMY mixed-color tone patch becomes achromatic, and keeps the density characteristics to tonality constant. This method can advantageously correct variations in the spectral characteristics of the color sensor because the CMY mixture rate is determined on the basis of the spectral reflectance characteristics of black.

However, in control (Japanese Patent Laid-Open No. 2003-084532) of adjusting CMY-mixed gray to the chromaticity of black (K), at least a K density control table must be updated before control using the color sensor, and preliminary single-color control is indispensable. When the updated density characteristics to tonality for K are not proper, i.e., the lightness of K serving as a reference varies to a non-negligible degree (only the lightness varies and a color difference $\Delta E$ permissible to a human being becomes $\Delta E>3$), the lightness of CMY-mixed gray varies following K variations. As a result, the characteristics of color process and halftone characteristics deviate from the density characteristics to tonality of each color that are set by the design.

SUMMARY OF THE INVENTION

The present invention has been made to overcome the conventional problems, and has as its feature to solve the drawbacks of the prior art.

It is another feature of the present invention to provide a color image forming apparatus excellent in the stability of color forming and the density characteristics to tonality, and a control method therefor.

According to an aspect of the present invention, there is provided with a color image forming apparatus for forming a color image on a recording medium by using a plurality of coloring materials including at least black, comprising:

test image forming means for forming a plurality of first test images of the black coloring material and a plurality of second test images of a mixture of color coloring materials on a recording medium on the basis of different tonality data;

detection means for detecting chromaticities of the first test images and the second test images which are formed on the recording medium;

acquisition means for acquiring, from pieces of lightness information contained in the chromaticities of the first test images that are detected by the detection means and correspond to respective first tonality data of black, respective second tonality data of black serving as reference lightnesses corresponding to the respective first tonality data;

correction means for correcting pieces of black lightness information corresponding to the respective second tonality data on the basis of the respective second tonality data acquired by the acquisition means and pieces of lightness information of the second test images detected by the detection means; and color correction means for correcting, by using chromaticities corresponding to the second tonality data acquired by the acquisition means as target chromaticities, mixture rates of the color coloring materials for the reference lightnesses on the basis of the target chromaticities and the chromaticities obtained by detecting the first test images by the detection means.

According to an aspect of the present invention, there is provided with a method of controlling a color image forming apparatus for forming a color image on a recording medium by using a plurality of coloring materials including at least black, comprising:

a test image forming step of forming on a recording medium a plurality of sets of test images including a plurality of test images of a mixture of color coloring materials and a black test image of the black coloring material;

a detection step of detecting chromaticities of the test images formed on the recording medium;

an acquisition step of acquiring, from pieces of lightness information contained in the chromaticities of the black test images in the plurality of sets that are detected in the detection step and correspond to respective first tonality data, second tonality data of black serving as reference lightnesses corresponding to the respective first tonality data;

a correction step of correcting pieces of black lightness information corresponding to the respective second tonality data on the basis of the respective second tonality data acquired in the acquisition step and pieces of lightness information of the black test images detected in the detection step; and a color correction step of correcting, by using chromaticities corresponding to the second tonality data acquired in the acquisition step as target chromaticities at tonalities, mixture rates of the color coloring materials for the reference lightnesses on the basis of the target chromaticities and the chromaticities obtained by detecting the test images corresponding to respective tonality data of the mixture of the color coloring materials in the detection step.

The above features are achieved by a combination of features described in main claims, and subclaims define merely advantageous concrete examples.

The general description of the present invention does not list all necessary features, and a subcombination of features can constitute the invention.

Other features, objects and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 depicts a table for explaining patch data for forming a CMY mixed-color patch and K single-color patch according to the first embodiment;

FIG. 12 depicts a table showing an example of pattern data of a CMY mixed-color patch and K single-color patch according to the second embodiment;

DETAILED DESCRIPTION OF THE PREFERRED EMBODIMENTS

Preferred embodiments of the present invention will be described in detail below with reference to the accompanying drawings. The following embodiments do not limit the invention defined by claims, and all combinations of features to be described in the embodiments are not indispensable to the solving means of the invention.

Figure 1:
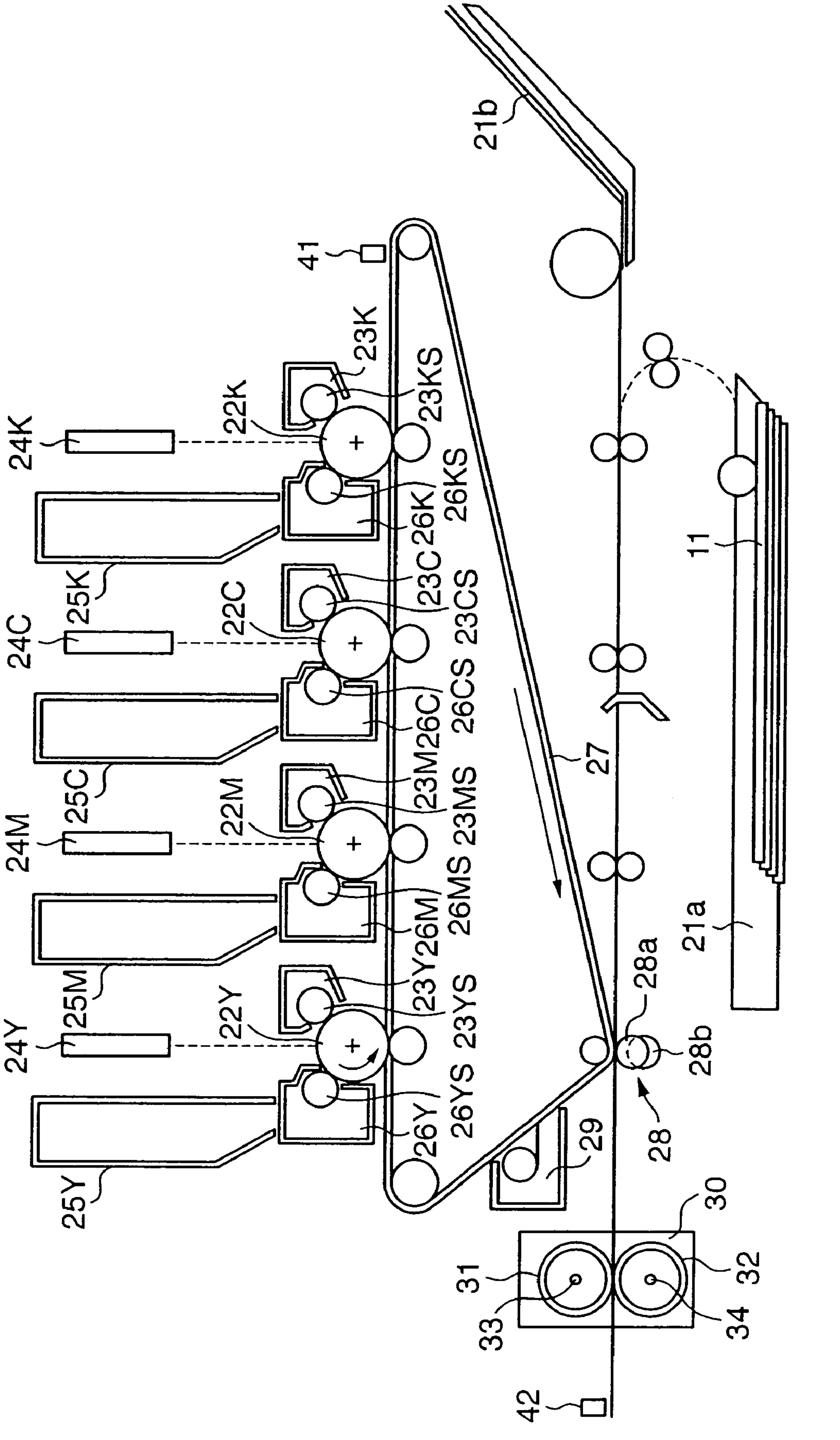
FIG. 1 depicts a view showing the arrangement of an image forming section of a tandem color image forming apparatus adopting an intermediate transfer material as an example of an electrophotographic color image forming apparatus according to an embodiment of the present invention.

FIG. 1 depicts a view showing the arrangement of an image forming section of a tandem color image forming apparatus adopting an intermediate transfer material 27 as an example of an electrophotographic color image forming apparatus according to an embodiment of the present invention.

In the image forming section of the color image forming apparatus according to the embodiment, as shown in FIG. 1, static latent images are respectively formed on photosensitive drums with laser beams controlled by an image processor (not shown) on the basis of an image signal, and these static latent images are developed with toners of corresponding colors to form single toner images, respectively. The single toner images are superposed on each other on the intermediate transfer material 27 to form a multi-color toner image. The multi-color toner image is transferred onto a transfer material 11 (sheet), and the multi-color toner image on the transfer material 11 is fixed by a fixing unit, forming a full color image.

The image forming section comprises paper cassettes 21*a* and 21*b*, photosensitive members (to be referred to as photosensitive drums hereinafter) 22Y, 22M, 22C, and 22K corresponding to stations which are arranged side by side by the number of developing colors, chargers 23Y, 23M, 23C, and 23K which constitute charge means as primary charge means, toner cartridges 25Y, 25M, 25C, and 25K, developers 26Y, 26M, 26C, and 26K which constitute developing means, the intermediate transfer material 27, a transfer roller 28, and a fixing unit 30.

Each of the photosensitive drums 22Y, 22M, 22C, and 22K is configured by forming an organic photoconductive layer around an aluminum cylinder. The photosensitive drums 22Y, 22M, 22C, and 22K are rotated counterclockwise in FIG. 1 in accordance with image forming operation by transmitting the driving force of a driving motor (not shown). The respective stations comprise, as primary charge means, the chargers 23Y, 23M, 23C, and 23K for respectively charging the photosensitive drums 22Y, 22M, 22C, and 22K for yellow (Y), magenta (M), cyan (C), and black (K). The respective chargers comprise sleeves 23YS, 23MS, 23CS, and 23KS. Laser beams to be sent to the photosensitive drums 22Y, 22M, 22C, and 22K are emitted by corresponding scanners 24Y, 24M, 24C, and 24K, and selectively expose the surfaces of the photosensitive drums 22Y, 22M, 22C, and 22K to form corresponding static latent images, respectively. The respective stations comprise, as developing means, the developers 26Y, 26M, 26C, and 26K for development in yellow (Y), magenta (M), cyan (C), and black (K) in order to visualize static latent images on the photosensitive drums, and the respective developers comprise sleeves 26YS, 26MS, 26CS, and 26KS. These developers are detachably attached to the image forming apparatus. The intermediate transfer material 27 is in contact with the photosensitive drums 22Y, 22M, 22C, and 22K. In forming a color image, the intermediate transfer material 27 rotates clockwise along with rotation of the photosensitive drums 22Y, 22M, 22C, and 22K, transferring toner images of the respective colors to overlap them on the intermediate transfer material 27. After that, the transfer roller 28 (to be described later) comes into contact with the intermediate transfer material 27 (at a position 28*a*), the transfer material 11 is clamped and conveyed by the transfer roller 28 and intermediate transfer material 27, and the multi-color toner image on the intermediate transfer material 27 is transferred onto the transfer material 11. The transfer roller 28 abuts against the transfer material 11 at the position 28*a* while the multi-color toner image is transferred onto the transfer material 11, and moves to a position 28*b* after the transfer process has completed.

The fixing unit 30 fuses and fixes the multi-color toner image transferred onto the transfer material 11 while conveying the transfer material 11 in the fixing unit 30. As shown in FIG. 1, the fixing unit 30 comprises a fix roller 31 which heats the transfer material 11, and a press roller 32 which presses the transfer material 11 against the fix roller 31. The fix roller 31 and press roller 32 are formed into a cylindrical shape, and incorporate heaters 33 and 34, respectively. The transfer material 11 bearing the multi-color toner image is conveyed by the fix roller 31 and press roller 32, and receives heat and a pressure to fix toner onto the surface of the transfer material 11. The transfer material 11 on which the toner image is fixed is discharged onto a delivery tray (not shown) by rotation of a discharge roller (not shown), and image forming operation ends.

A cleaning unit 29 removes toner remaining on the intermediate transfer material 27 after transferring onto the transfer material 11. The removed waste toner is stored in a cleaner container (not shown). Reference numeral 42 denotes a color sensor which optically detects the color of a color image (in this case, a color patch) transferred and fixed onto the transfer material 11. The paper cassette 21*a* stacks and stores a plurality of transfer materials 11 (recording sheets or the like). Also, the paper tray 21*b* stacks and stores a plurality of transfer materials 11 (recording sheets or the like). A density sensor 41 faces the intermediate transfer material 27, and is used to measure the toner density of a patch formed on the surface of the intermediate transfer material 27.

Figure 2:
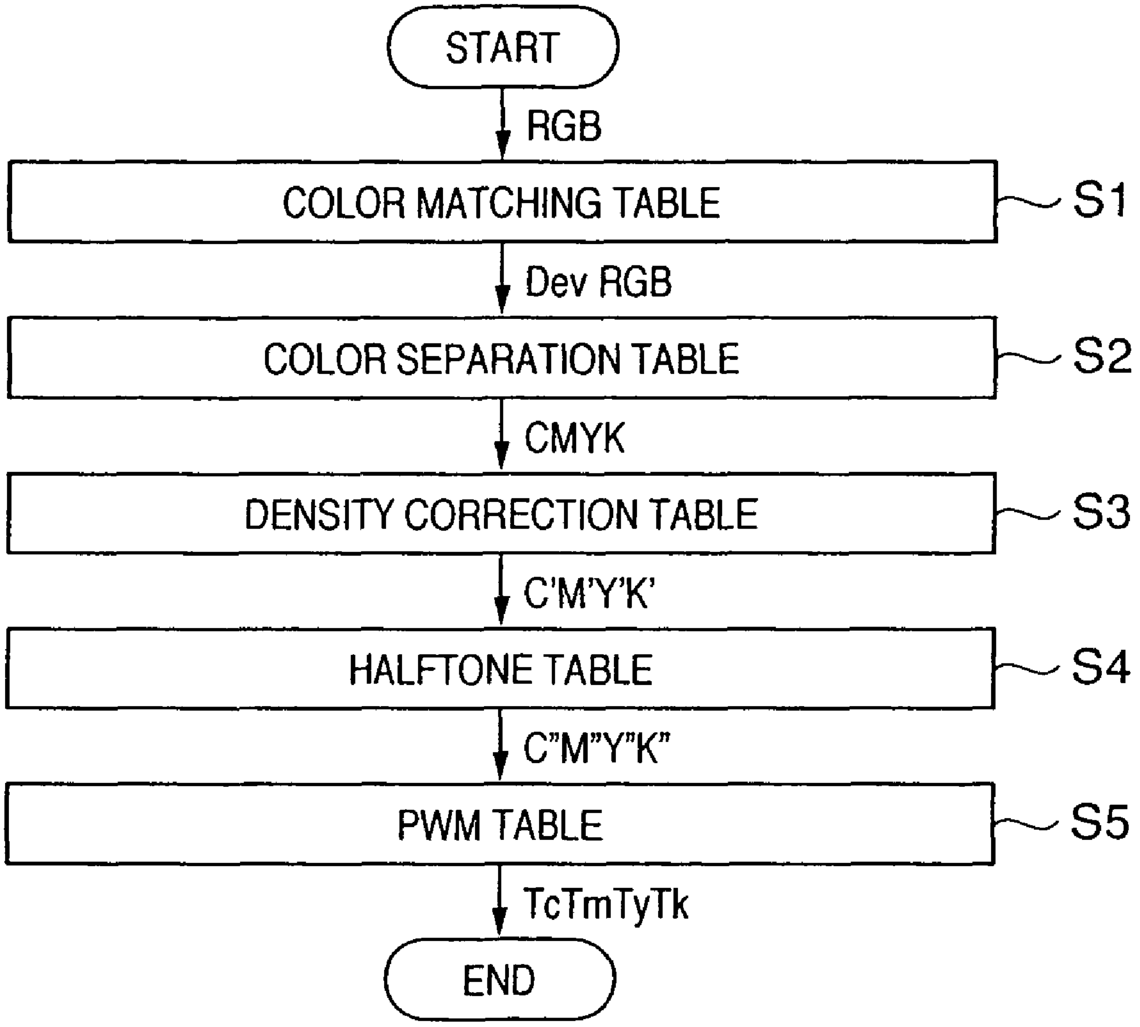
FIG. 2 is a flowchart for explaining an image forming process in the color image forming apparatus according to the embodiment.

FIG. 2 is a flowchart for explaining an image forming process in the color image forming apparatus according to the embodiment.

In step S1, R, G, and B signals sent from a host computer or the like are converted into device R, G, and B signals (to be referred to as Dev R, G, and B signals hereinafter) complying with the color reproduction range of the color image forming apparatus on the basis of a color matching table 321 (FIG. 3) prepared in advance. In step S2, the Dev R, G, and B signals are converted into C, M, Y, and K signals corresponding to the colors of toners (coloring materials) of the color image forming apparatus on the basis of a color separation table 322 (FIG. 3) prepared in advance. In step S3, the C, M, Y, and K signals are corrected and converted into C', M', Y', and K' signals on the basis of a density correction table 323 (FIG. 3) for correcting the density characteristics to tonality specific to each image forming apparatus. In step S4, a halftone process such as dithering is performed to convert the C', M', Y', and K' signals into C", M", Y", and K" signals. When one pixel is represented by multi data, in step S5, exposure times Tc, Tm, Ty, and Tk of the scanners 24C, 24M, 24Y, and 24K corresponding to the C", M", Y", and K" signals are determined using a PWM (Pulse Width Modulation) table 324 (FIG. 3) and outputted.

As described above, the density sensor 41 faces the intermediate transfer material 27, and measures the density of a toner patch formed on the surface of the intermediate transfer material 27.

Figure 3:
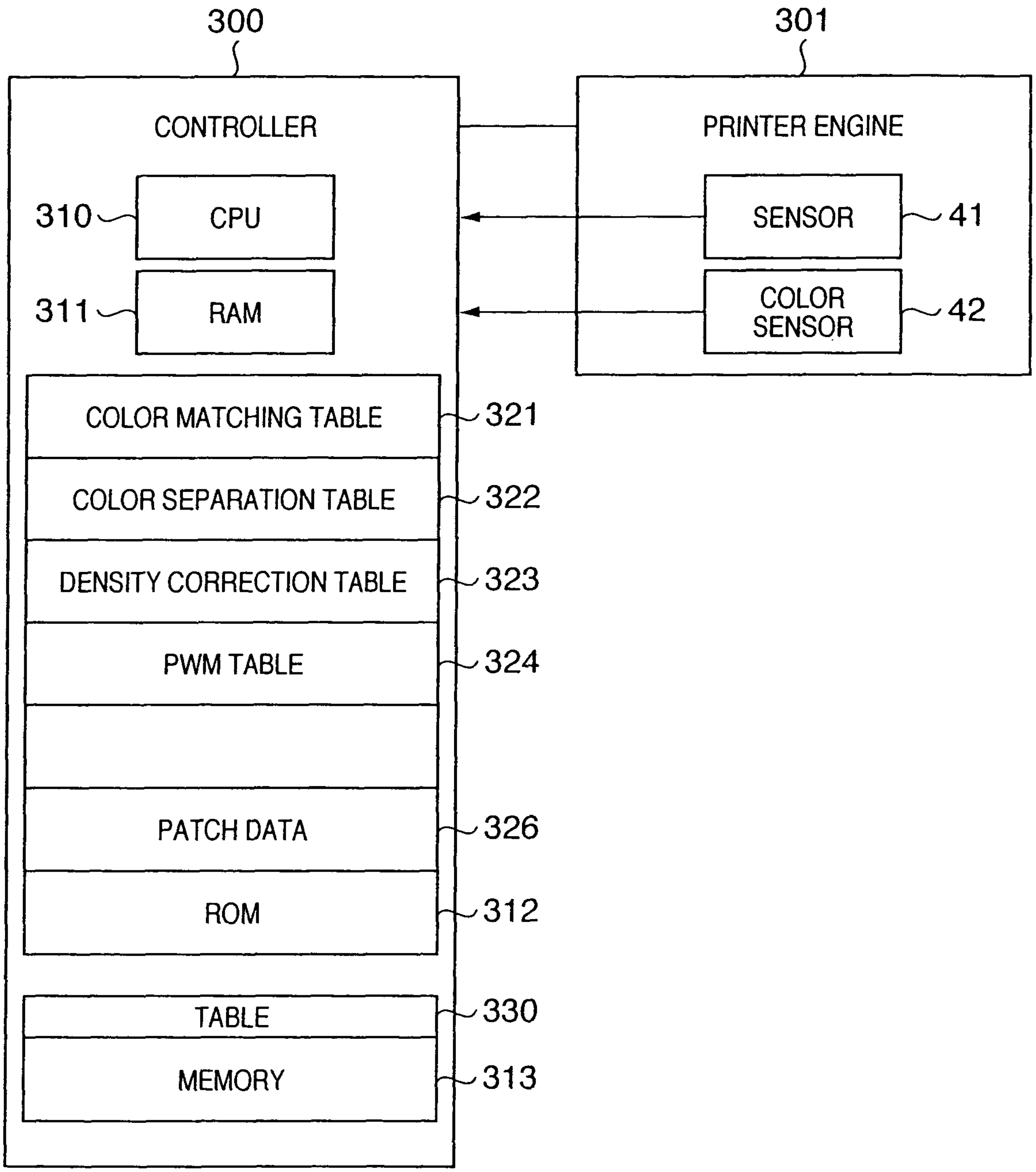
FIG. 3 is a block diagram showing the arrangement of the color image forming apparatus according to the embodiment.

FIG. 3 is a block diagram showing the arrangement of the color image forming apparatus according to the embodiment.

In FIG. 3, reference numeral 300 denotes a controller which controls the operation of the whole color image forming apparatus. A printer engine 301 has an image forming section having the arrangement as shown in FIG. 1, and forms an image on a recording paper sheet serving as a transfer material in accordance with a control signal and data from the controller 300.

The controller 300 comprises a CPU 310 such as a microprocessor, a RAM 311 which is used as a work area for storing various data in control operation by the CPU 310 and temporarily stores various data, and a ROM 312 which stores programs and data to be executed by the CPU 310. The ROM 312 holds the above-mentioned color matching table 321, color separation table 322, density correction table 323, and PWM table 324. The ROM 312 also provides a patch data area 326 which stores patch pattern data (to be described later). A memory 313 is a rewritable nonvolatile memory which stores table 330 to be described later with reference to FIG. 9. If table 330 is fixed, it may also be stored in the ROM 312. The density correction table 323 is set for each of Y, M, C, and K, the ROM 312 stores the default tables, and the table 330 of the memory 313 stores Y, M, C, and K density correction tables updated by a process to be described later.

Figure 4:
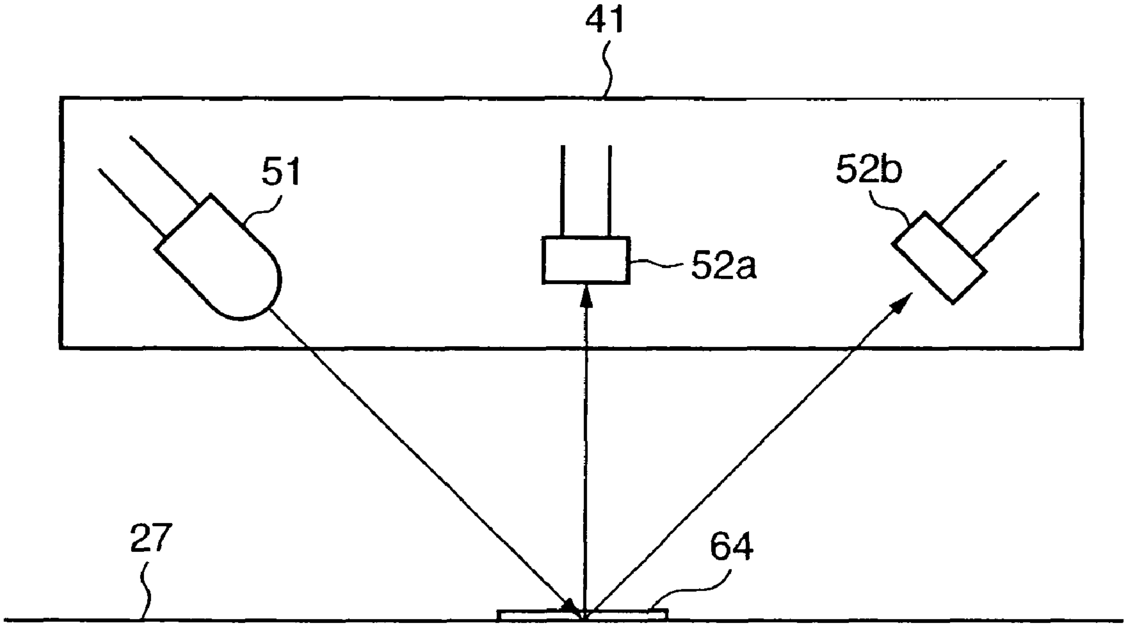
FIG. 4 depicts a view showing an example of the arrangement of a density detection sensor which detects the density of unfixed toner on an intermediate transfer material according to the embodiment.

FIG. 4 depicts a view showing an example of the arrangement of the density sensor 41 which detects the density of an unfixed toner image on the intermediate transfer material 27 according to the embodiment.

The density sensor 41 is made up of an infrared light emitting device 51 such as an LED, light sensors 52 (52*a* and 52*b*) such as photodiodes, an integrated circuit (not shown) which processes signals detected by the light sensors 52*a* and 52*b*, and a holder (not shown) which stores these members. The light sensor 52*a* detects the intensity of light diffusedly reflected by a patch 64 on the intermediate transfer material 27, whereas the light sensor 52*b* detects the intensity of light regularly reflected by the patch 64 on the intermediate transfer material 27. By detecting both the intensity of regularly reflected light and that of diffusedly reflected light, the density of the patch 64 can be detected from high to low densities. The density detected by the density sensor 41 is independent of the color of the intermediate transfer material 27.

The density sensor 41 cannot identify the color of a toner image formed on the intermediate transfer material 27. Thus, the patch 64 for detecting the tonality of single toner is formed on the intermediate transfer material 27. Density data of the patch 64 detected by the density sensor 41 is fed back to the density correction table 323 for correcting the density characteristics to tonality, and the conditions for processing in the printer engine 301. However, the first and second embodiments do not use the detection result of the density sensor 41.

Figure 5A:
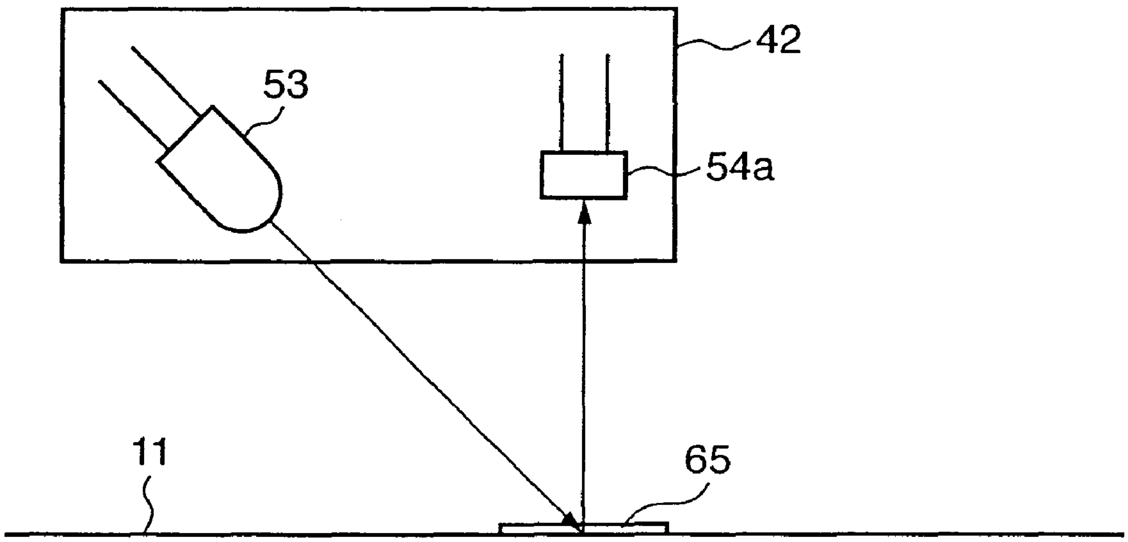
FIGS. 5A and 5B depict views for explaining the arrangement of a color sensor according to the embodiment of the present invention.
Figure 5B:
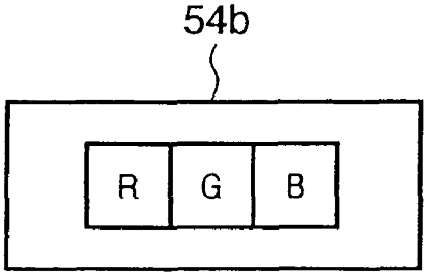

FIGS. 5A and 5B depict views for explaining the arrangement of the color sensor 42 according to the embodiment of the present invention.

As shown in FIG. 1, the color sensor 42 is arranged on the downstream side of the fixing unit 30 on the convey path of the transfer material 11 so as to face the image forming surface of the transfer material 11. The color sensor 42 obtains an RGB value of a single or mixed color from a fixed patch 65 formed on the transfer material 11. The RGB value is converted into chromaticity information by a mathematical process such as linear transform, a learning process using a neural net, or the like. Control corresponding to the density or chromaticity of the fixed patch 65 formed on the transfer material 11 is performed on the basis of the chromaticity information. In this manner, the density and chromaticity of a patch transferred and fixed onto the transfer material 11 can be automatically detected before the fixed image is discharged to the delivery portion.

As shown in FIG. 5A, the color sensor 42 comprises a white LED 53 and a charge storage sensor 54*a* with an RGB on-chip filter. White light is emitted by the white LED 53 obliquely at 45° to the transfer material 11 having the fixed patch 65, and the intensity of light diffusedly reflected at 0° is detected by the charge storage sensor 54*a*.

FIG. 5B depicts a view showing a light sensing portion 54*b* of the charge storage sensor 54*a*. The light sensing portion 54*b* has R, G, and B filters and corresponding sensors, and detects the pixel of each independent color in accordance with each filter. The charge storage sensor 54*a* may be formed from a photodiode, or several sets of three R, G, and B pixels which are arranged side by side. The incident angle is 0° and the reflection angle may be 45°. The charge storage sensor may be made up of an LED which emits beams of three, R, G, and B colors and a sensor with no filter.

An image forming apparatus will be explained in which, even when the lightness component of a K single-color patch varies, the same color as a designed one can be formed by detecting chromaticity of the K single-color patch K and that of a CMY mixed-color patch using the color sensor 42 according to the embodiment, without detecting the density of a patch using the density sensor 41.

Figure 6:
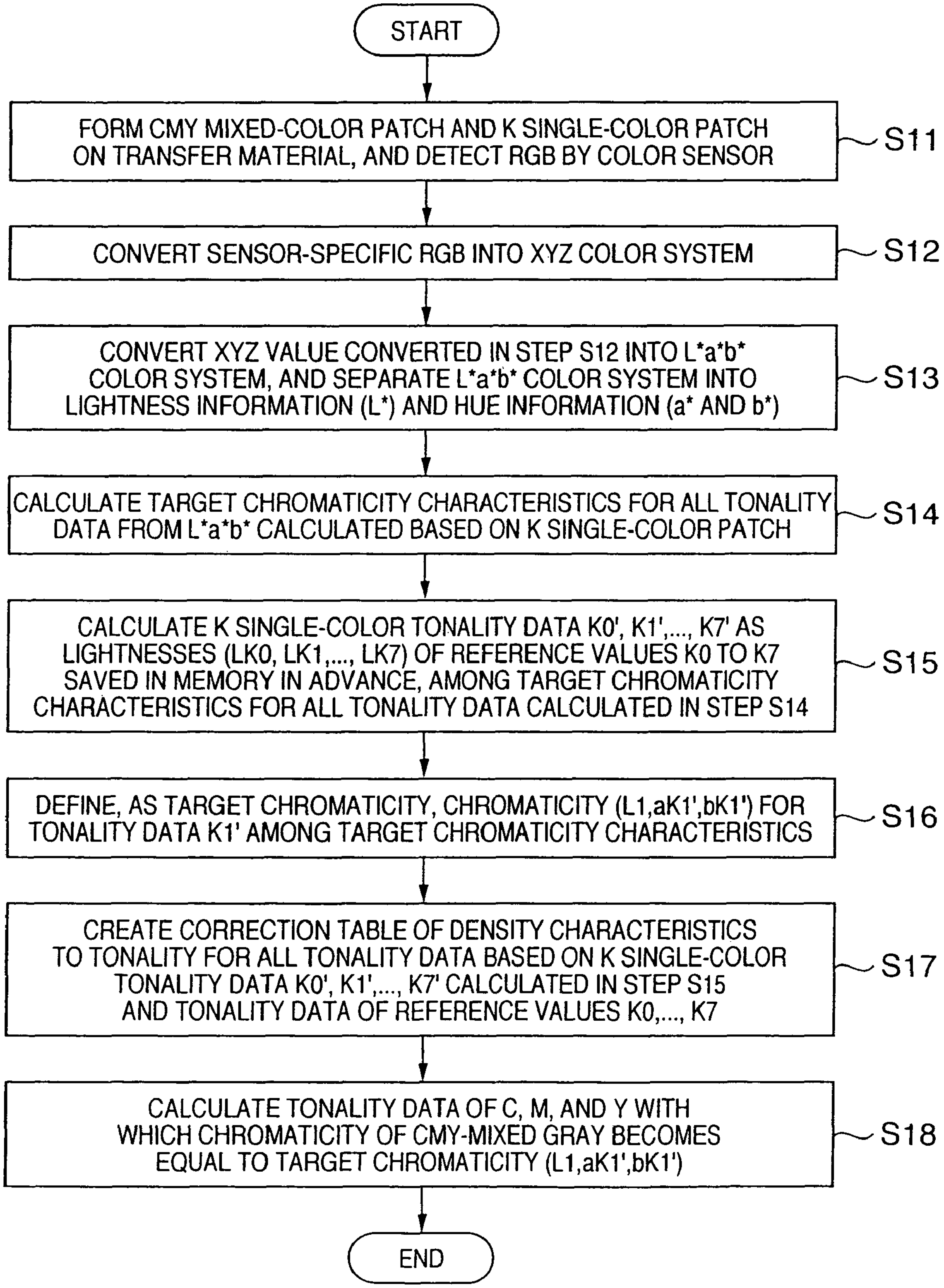
FIG. 6 is a flowchart for explaining a sequence of obtaining correction data for correcting image forming conditions in the color image forming apparatus according to the first embodiment of the present invention.

FIG. 6 is a flowchart for explaining control for the stability of color forming by using the color sensor 42 in the color image forming apparatus according to the embodiment. A program for executing this process is stored in the ROM 312.

In step S11, a CMY mixed-color patch and K single-color patch are formed and fixed on the transfer material 11, and the colors of these patches are detected by the color sensor 42.

FIG. 7 depicts a table for explaining patch data for forming a CMY mixed-color patch and black (K) single-color patch.

The patch is formed based on a CMY mixed-color patch pattern having a set of seven patches (0-0) to (0-6) and a K single-color patch pattern having a set of eight patches (0-K0) to (0-K7).

The patch (0-0) is formed from reference tonality data (to be referred to as C, M, and Y reference values hereinafter) C1, M1, and Y1. The patches (0-1) and (0-2) are prepared by changing the C tonality from the reference value C1 by ±α while keeping the M and Y tonalities at the reference values M1 and Y1. Similarly, the patches (0-3) and (0-4) are prepared by changing the M tonality from the reference value M1 by ±α while keeping the C and Y tonalities at the reference values C1 and Y1. The patches (0-5) and (0-6) are prepared by changing the Y tonality from the reference value Y1 by ±α while keeping the C and M tonalities at the reference values C1 and M1.

The K single-color patches (0-K0) to (0-K7) are formed from black reference tonality data (to be referred to as K reference values hereinafter) K0, K1, K2, . . . , K7. These K reference values monotonically increase from low to high densities in an order of K0 to K7. The density characteristics to tonality for the C, M, and Y reference values C1, M1, and Y1 are adjusted to predetermined density characteristics to tonality. These C, M, and Y reference values are set so that a mixture of C1, M1, and Y1 produces the same color as that of the reference value K1 under general image forming conditions. These reference values are set in designing a color process and density process, and the lightness components (to be referred to as L0, L1, L2, . . . , L7 hereinafter) of the chromaticities of the reference value K1 and remaining reference values K0, K2, . . . , K7 are stored in the patch data area 326 of the ROM 312.

Figure 8:
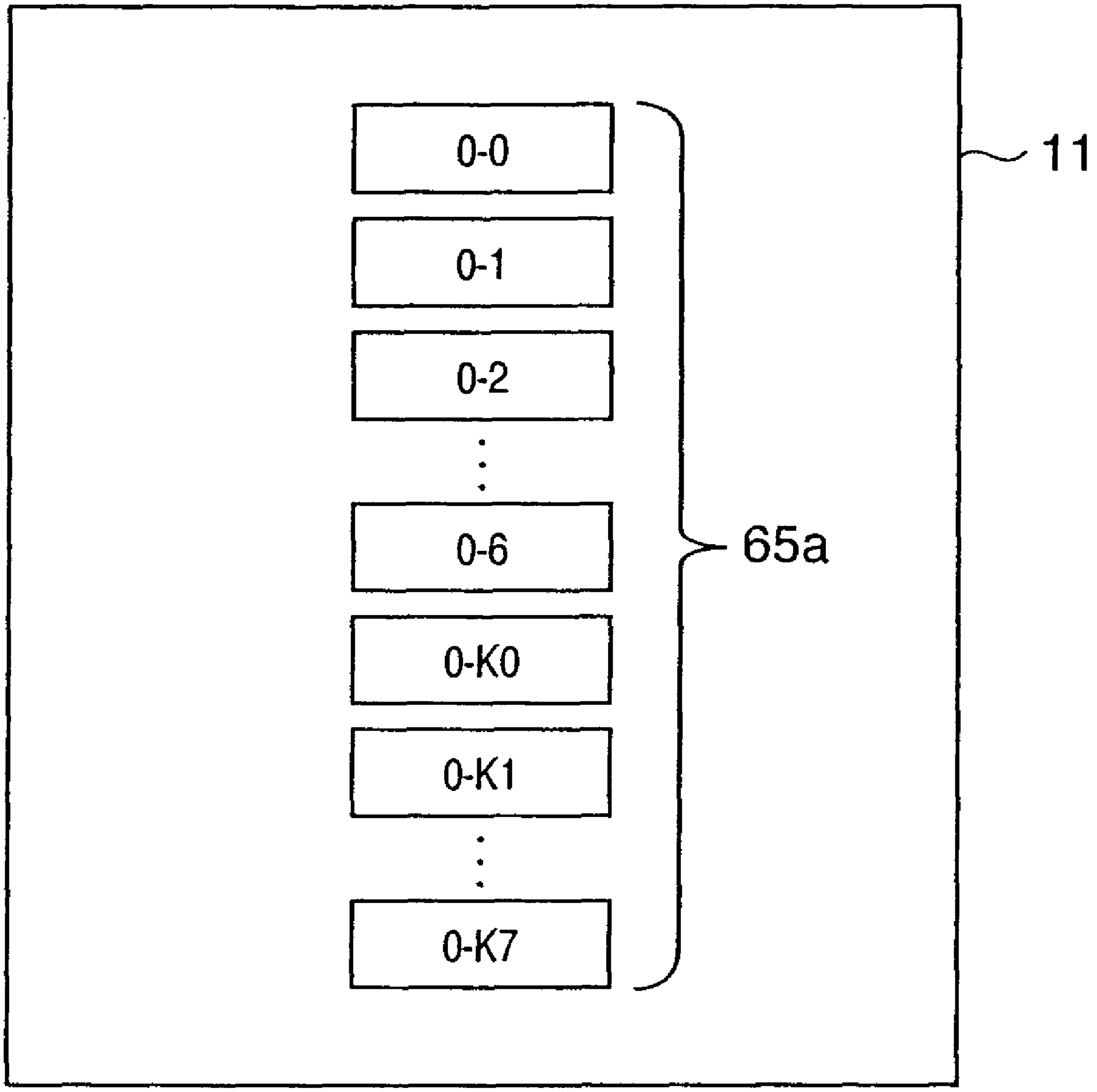
FIG. 8 depicts a view showing an example of CMY mixed-color patches (0-0) to (0-6) and K single-color patches (0-K0) to (0-K7) formed on a transfer material on the basis of the patch data shown in FIG. 7.

FIG. 8 depicts a view showing an example of the CMY mixed-color patches (0-0) to (0-6) and K single-color patches (0-K0) to (0-K7) formed on the transfer material 11 on the basis of the patch data shown in FIG. 7.

In FIG. 8, a total of 15 patches 65*a* (equivalent to the patch 65 in FIG. 5), i.e., CMY mixed-color patches (0-0) to (0-6)

and K single-color patches (0-K0) to (0-K7) based on the patch data in FIG. 7 are formed on the transfer material 11. The patches 65*a* formed on the transfer material 11 pass through the fixing unit 30, are detected by the color sensor 42, and outputted as R, G, and B values specific to the color sensor 42. The R, G, and B values detected and outputted by the color sensor 42 are different at high possibility from the reference values K1, C1, M1, and Y1 depending on the state of the color image forming apparatus, and other conditions such as the environment.

Referring back to FIG. 6, R, G, and B values outputted from the color sensor 42 are converted into an XYZ color system by linear transform using a matrix operation in step S12. In this case, R, G, and B values are converted into an XYZ color system by linear transform, but higher-order transform may be executed to reduce a conversion error because the RGB filter characteristic of the color sensor 42 is nonlinear to the characteristic of an ideal XYZ color matching function.

This transformation is give by equation (1). In this equation, A represents a 3×3 matrix, and B represents a 1×3 matrix.

$$\begin{bmatrix} X \\ Y \\ Z \end{bmatrix} = A \times \begin{bmatrix} R \\ G \\ B \end{bmatrix} + B \quad (1)$$

In step S13, the X, Y, and Z values converted in step S12 are converted into an L*a*b* color system by using the following equation (2). In this way, the chromaticity information detected by the color sensor 42 is separated into lightness information (L*) and hue information (a* and b*).

At this time, the R, G, and B outputs specific to the color sensor 42 are converted into an XYZ color system, and then into an L*a*b* color system in an order of steps S12 and S13. Alternatively, for example, sensor-specific R, G, and B outputs may be directly converted into an L*a*b* color system by learning using a neural net.

$$L^* = 116(Y/Y_0)^{1/3} - 16$$

$$a^* = 500 \times \{(X/X_0)^{1/3} - (Y/Y_0)^{1/3}\}$$

$$b^* = 200 \times \{(Y/Y_0)^{1/3} - (Z/Z_0)^{1/3}\} \quad (2)$$

where $X_0=96.42$, $Y_0=100$, and $Z_0=82.51$

The process advances to step S14 to obtain chromaticity characteristics (910) for all K tonalities by performing a mathematical process such as linear transform from the L*a*b* components (LK0,aK0,bK0), (LK1,aK1,bK1), . . . (LK7,aK7,bK7) of the chromaticity-converted K reference values K0, K1, . . . K7 attained by reading the K single-color patches (0-K0) to (0-K7), as shown in FIGS. 9 and 10.

Figure 9:
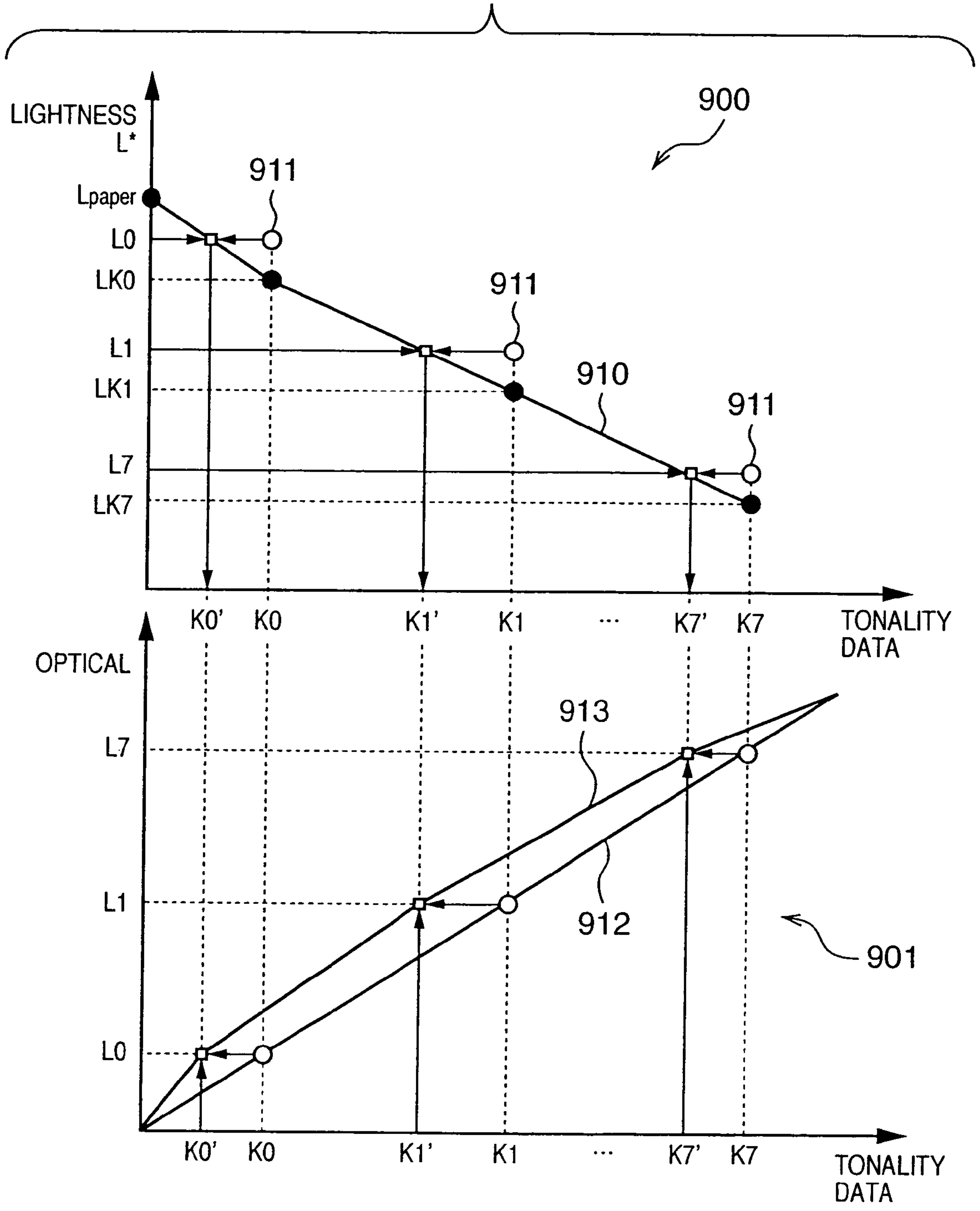
FIG. 9 is a graph for explaining the relationship between the tonality data and lightness of a K single-color patch and the density characteristics to tonality of a density correction table according to the first embodiment of the present invention.
Figure 10:
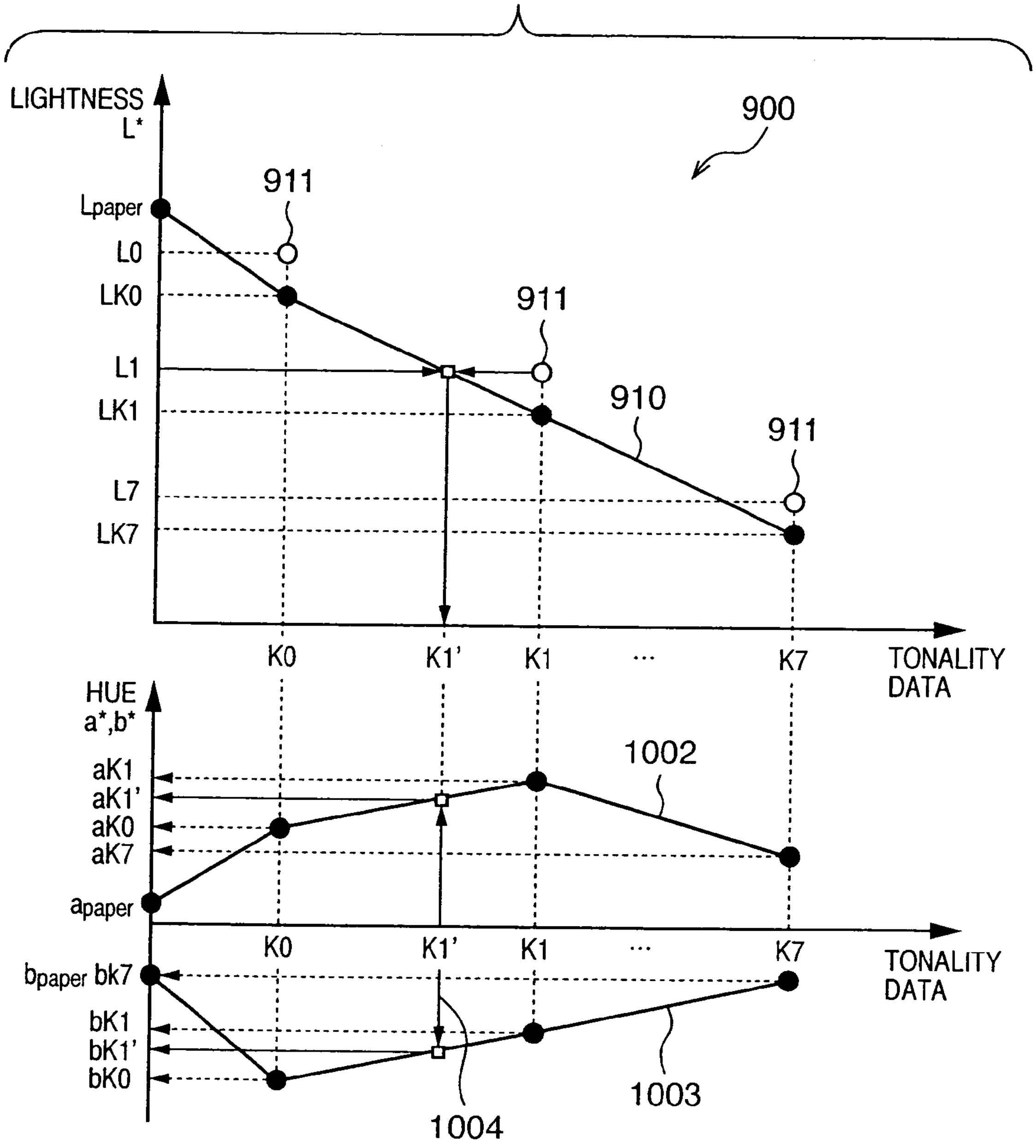
FIG. 10 is a graph for explaining a method of calculating the color specification according to the first embodiment.

In step S15, tonality data K0', K1', . . . , K7' having the same lightnesses as the lightnesses (L0, L1, . . . , L7) of the K reference values K0, K1, . . . , K7 stored in the ROM 312 are obtained for the chromaticity characteristics (910) for all tonalities that are calculated in step S14 (FIG. 9). In step S16, a chromaticity (L1,aK1',bK1') is obtained as a combination of the hue (aK1',bK1') (FIG. 10) at the tonality data K1' attained in step S15 and the lightness L1 corresponding to the tonality data K1, and is defined as a target chromaticity (1004 in FIG. 10).

In step S17, as shown in FIG. 9, the correction table of K single-color density characteristics to tonality that always keeps the density characteristics to tonality in a desired state is created using the linear relationship between the lightness and the density without using the density detection result of the density sensor 41.

FIG. 9 is a graph for explaining the relationship between the tonality data and lightness of a K single-color patch and the density characteristics to tonality of the density correction table according to the first embodiment of the present invention.

A graph 900 represents the relationship between the tonality data and detected lightness of a K single-color patch. In this example, an estimated lightness line 910 for all tonalities is obtained by detecting patches formed on the basis of the K reference values K0, K1, . . . , K7 by the color sensor 42, and performing linear interpolation between these detection results and lightnesses (LK0, LK1, . . . LK7) (full circles in FIG. 9) attained upon chromaticity-converting the detection results. Points 911 represent reference lightnesses (L0, L1, . . . , L7) corresponding to the predetermined K reference values K0 to K7 as desired characteristics (open circles in FIG. 9: these values are stored in the patch data area 326 of the ROM 312). K single-color tonalities on the estimated lightness line 910 that are calculated in step S15 and exhibit the same lightnesses as the reference lightnesses (L0, L1, . . . , L7) are represented by K0', K1', . . . , K7'. These tonalities K0', K1', . . . K7' are obtained in the process of step S15 in FIG. 6.

A graph 901 represents the density characteristics to tonality data of the black density correction table. The abscissa represents K single-color tonality data, and the ordinate represents output tonality (detected density). A line 912 represents the initial characteristics of the black density correction table that correspond to tonality data K0, K1, . . . , K7 representing the K single-color density characteristics to tonality. Lightnesses (L0, L1, . . . , L7) are set for the respective K reference values K0 to K7.

To the contrary, a line 913 represents the correction characteristics of the black density correction table for obtaining tonalities (densities) given by the line 912 for the tonality data K0', K1', . . . , K7'. A black density correction table having K single-color density characteristics to tonality as represented by the line 913 is created in the memory 313 by using a mathematical process such as linear interpolation. Even if the lightness of an image formed in accordance with predetermined K single-color tonality data varies, an image having a predetermined lightness can be obtained by correcting tonality data on the basis of the density correction table, and desired density characteristics to tonality can always been maintained. Accordingly, K single-color density characteristics to tonality can be kept at desired characteristics without performing density control using the density sensor 41.

The processes in steps S16 and S18 of FIG. 6 will be explained in more detail with reference to FIG. 10.

FIG. 10 is a graph for explaining a method of calculating the color specification according to the first embodiment. The part 900 is the same as that in FIG. 9.

In FIG. 10, lightnesses (LK0, LK1, . . . LK7) and hues (aK0, bK0, bK1, . . . aK7, bK7) corresponding to the chromaticity-converted K reference values K0, K1, . . . , K7 on the estimated lightness line 910 are represented by full circles. These points are linearly interpolated in step S14, and target chromaticity characteristics for tonality data are given by the estimated lightness line 910 for the lightness L* component, an estimated hue a* component line 1002, and an estimated hue b* component line 1003.

Also, open circles 911 represent the lightnesses (L0, L1, . . . , L7) of the K reference values K0 to K7 described above. In step S15, the K single-color tonality data K0', K1', . . . , K7' which exhibit the same lightnesses as the lightnesses (LK0, LK1, . . . LK7) of the K reference values K0, K1, . . . , K7 saved in the ROM 312 are obtained from the estimated lightness line 910 (lightness L* component) among chromaticity characteristics for all tonality data that are calculated in step S14.

In step S16, chromaticity characteristics represented by the estimated hue a* component line 1002 and estimated hue b* component line 1003 are searched for the hue a* and b* values for the tonality K1'. The obtained chromaticity (L1, aK1',bK1') is defined as the target chromaticity (1004 in FIG. 10) of CMY-mixed gray formed from C, M, and Y. In step S18, the mixture rate (each tonality data) of C, M, and Y at CMY color mixture which produces the same chromaticity as the target chromaticity (L1,aK1',bK1') calculated in step S16 is calculated. Calculation of the C, M, and Y tonality data uses conventionally known multiple regression.

The process of step S18 will be explained on the basis of the patch according to the embodiment.

Tonality data of the CMY mixed-color patches (0-0) to (0-6) detected by the color sensor 42 are sequentially set to (0-0)=(C00,M00,Y00) to (0-6)=(C06,M06,Y06), and the measured L*a*b* values of the CMY mixed-color patches are set to (0-0)=(L00,a00,b00), . . . , (0-6)=(L06,a06,b06). The relationship between the L*a*b* color system, C, M, and Y can be given by the following equation (3). The measured L*a*b* values (0-0)=(L00,a00,b00), . . . (0-6)=(L06,a06, b06) of the CMY mixed-color patches are substituted into the left-hand side (L*,a*,b*) of equation (3), and the tonality data (0-0)=(C00,M00,Y00) to (0-6)=(C06,M06,Y06) of the CMY mixed-color patches are substituted into its right-hand side (C,M,Y). Hence, seven simultaneous equations are established for the L*, a*, and b* components.

$$\begin{bmatrix} L^* \\ a^* \\ b^* \end{bmatrix} = P\times\begin{pmatrix} C \\ M \\ Y \end{pmatrix} + q = \begin{bmatrix} P_{11} & P_{12} & P_{13} \\ P_{21} & P_{22} & P_{23} \\ P_{31} & P_{32} & P_{33} \end{bmatrix} \times \begin{pmatrix} C \\ M \\ Y \end{pmatrix} + \begin{bmatrix} q_1 \\ q_2 \\ q_3 \end{bmatrix} \tag{3}$$

When the L* component is exemplified, four unknown values $P_{11}$, $P_{12}$, $P_{13}$, and $q_1$ can be calculated from known seven L*, C, M, and Y by multiple regression. As for the hue a* and b* components, $P_{21}$, $P_{22}$, $P_{23}$, $q_2$, $P_{31}$, $P_{32}$, $P_{33}$, and $q_3$ are obtained, and the transform matrices P and q for transforming tonality data of C, M, and Y into the chromaticity of L*, a*, and b* can be calculated. The C, M, and Y values for the target chromaticity (L1,aK1',bK1') calculated in step S16 are represented by (C0',M0',Y0'), and given by a matrix using q and an inverse matrix $P^{-1}$ of the previous calculated P:

$$\begin{pmatrix} C \\ M \\ Y \end{pmatrix} = P^{-1}\times\left[\begin{pmatrix} L^* \\ a^* \\ b^* \end{pmatrix} - q\right] = \begin{bmatrix} P_{11} & P_{12} & P_{13} \\ P_{21} & P_{22} & P_{23} \\ P_{31} & P_{32} & P_{33} \end{bmatrix}^{-1} \times \left[\begin{pmatrix} L^* \\ a^* \\ b^* \end{pmatrix} - \begin{pmatrix} q_1 \\ q_2 \\ q_3 \end{pmatrix}\right] \tag{4}$$

The target control chromaticity (LK0,aK0,bK0) is substituted into the right-hand side (L*,a*,b*) of equation (4), thereby obtaining (C0',M0',Y0'). (C0',M0',Y0') is fed back to the CMY density correction table of the density correction table in the memory 313 that is used to correct the density characteristics to tonality specific to the color image forming apparatus. As a result, the same color as a designed one can be outputted even upon variations in lightness to tonality data of a K single-color patch.

By the above-described control for the stability of color forming in the color image forming apparatus according to the first embodiment, desired density characteristics to tonality can always be obtained even upon variations in the lightness of a K image with respect to K tonality data. The mixture rate of C, M, and Y for forming CMY-mixed gray which coincides with a target chromaticity is calculated from hue information of a detected K single-color patch. A color formed by C, M, and Y can be adjusted to a designed color even upon variations in the lightness component of a formed K image.

Since the coloring material of a K single-color patch has a single color (black), the detection result of the patch hardly shifts in the hue direction. When the density of the K single-color patch varies, it shifts in the lightness direction, and the shift in the lightness direction is corrected to a designed color, thereby implementing the stability of color forming as a whole.

Second Embodiment

The second embodiment of the present invention will be explained. In the second embodiment, the chromaticities of a plurality of sets of mixed-color patch patterns having different C, M, and Y reference values on a transfer material 11 are detected by a color sensor 42. The mixture rates of C, M, and Y which form a plurality of CMY mixed colors for target chromaticities are calculated on the basis of the detected chromaticities, and the density characteristics to tonality are controlled for all tonality data. This can implement the stability of color forming in a wider color gamut, and the density characteristics to tonality can be controlled without performing density control using a density sensor 41 not only for K but also for C, M, and Y.

Figure 11:
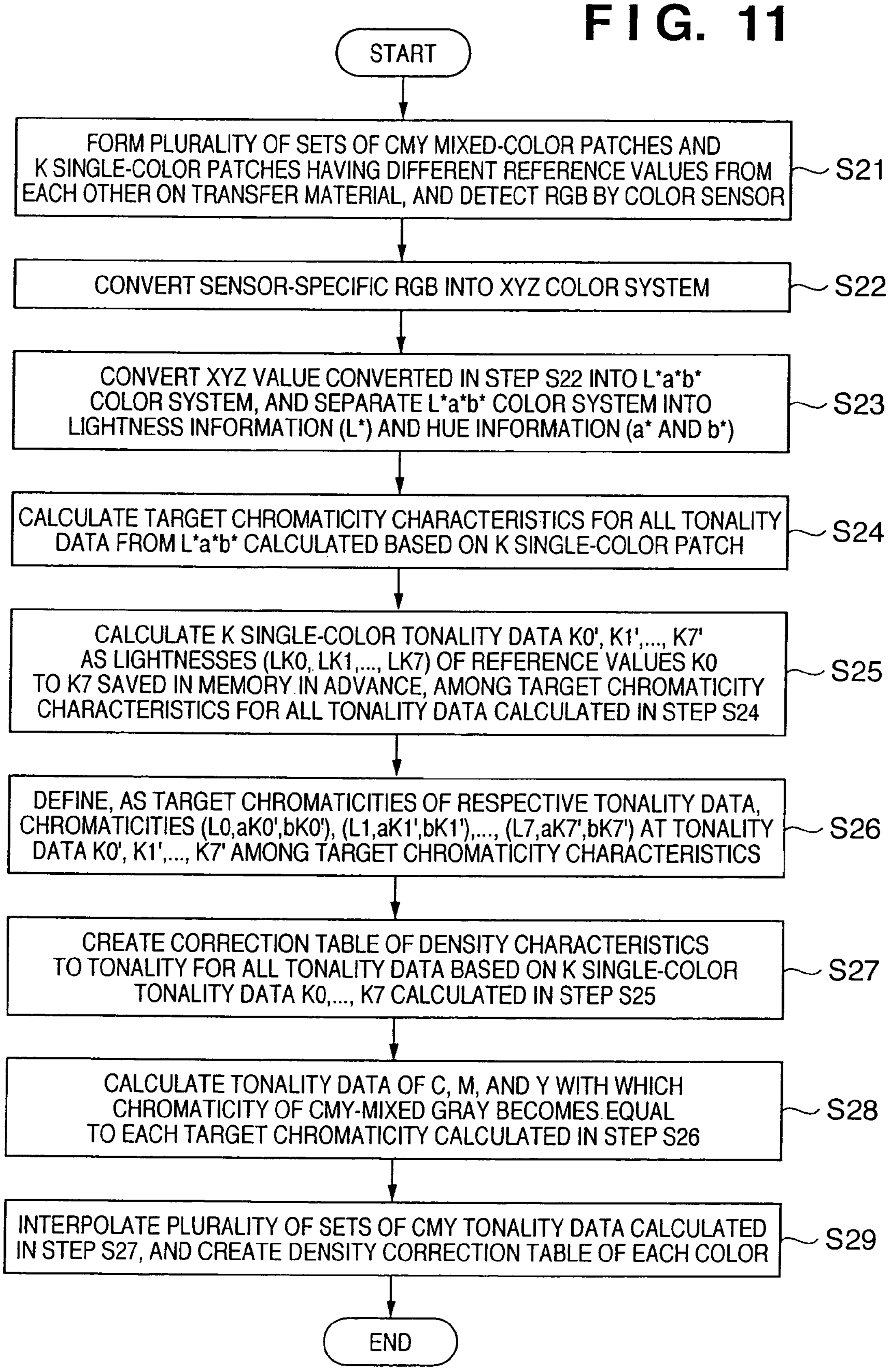
FIG. 11 is a flowchart for explaining a control process for the stability of color forming by using a color sensor according to the second embodiment of the present invention.

FIG. 11 is a flowchart for explaining a control process for the stability of color forming by using the color sensor 42 according to the second embodiment. Note that the arrangement of a color image forming apparatus according to the second embodiment is the same as that in the first embodiment, and a description thereof will be omitted.

In step S21, CMY mixed-color patch patterns and K single-color patch patterns having different reference values are formed on the transfer material 11, and detected by the color sensor 42.

FIG. 12 depicts a table showing an example of pattern data of the CMY mixed-color patch and K single-color patch according to the second embodiment.

The pattern data is formed from a total of eight sets of eight patches each including seven CMY mixed-color patches and one K single-color patch, i.e., a total of 64 patches.

The 0th set of eight patches (0-0 to 0-7) will be exemplified with reference to FIG. 12. The patches of the 0th set are seven CMY mixed-color patches (0-0) to (0-6) and one K single-color patch (0-7). C, M, and Y tonality data of the patches (0-0) to (0-6) are combinations of the C, M, and Y reference values C0, M0, and Y0 and patch data prepared by changing tonality data of specific colors from the C, M, and Y reference values by ±α, as shown in FIG. 12. The patch (0-7) is a K single-color patch, and is formed from the K reference value K0.

The reference values C0, M0, Y0, and K0 of the respective colors are set in designing a color process and density process so that the density characteristics to tonality of C, M, Y, and K are adjusted to a desired tonality-to-density curve and mixing of the values C0, M0, and Y0 produces the same color as that of K0 under general image forming conditions. The K reference values K0 to K7 in the respective patch sets are so set as to monotonically increase from low to high densities. CN, MN, and YN (N=0, . . . , 7) are set to values at which mixing of them produces the same color as KN. In setting, the lightness components (to be referred to as L0, L1, . . . , L7 hereinafter) of the chromaticities of the K reference values K0, K1, . . . K7 are stored in a ROM 312 of the color image forming apparatus.

Figure 13:
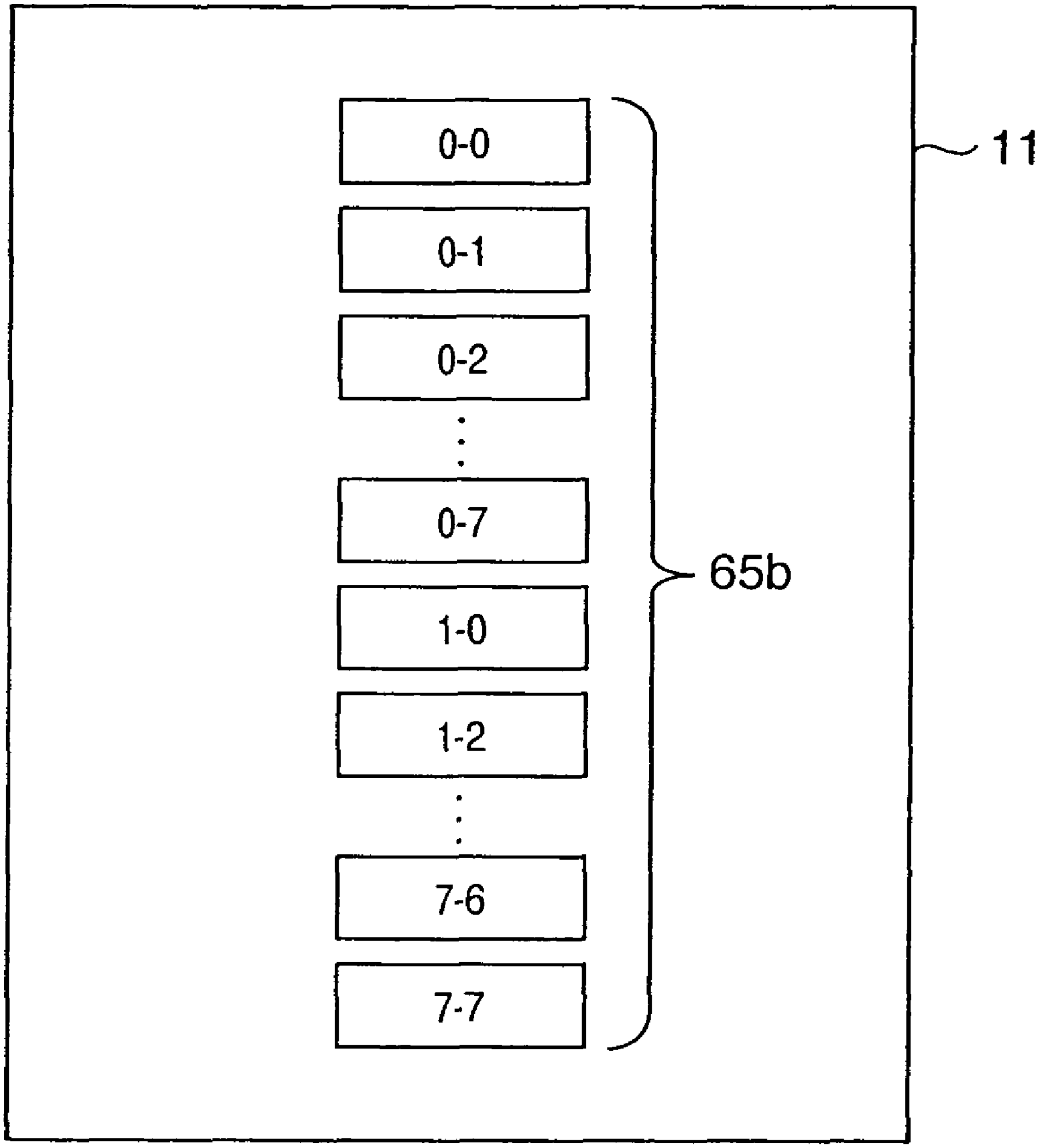
FIG. 13 depicts a view showing an example of a patch pattern formed on a transfer material on the basis of the patch data in FIG. 12 according to the second embodiment of the present invention.

FIG. 13 shows an example of a patch pattern formed on the transfer material 11 on the basis of the patch data of FIG. 12 according to the second embodiment of the present invention.

In this case, 64 patches 65*b* formed from the patches (0-0) to (7-7) are formed on the transfer material 11. The patches 65*b* formed on the transfer material 11 pass through a fixing unit 30, are detected by the color sensor 42, and outputted as R, G, and B values. Upon a change in the state of the color image forming apparatus or the like, the R, G, and B values outputted from the color sensor 42 may vary from those in obtaining the reference values KN, CN, MN, and YN (N=0, . . . , 7), and the R, G, and B values may vary along with this.

Referring back to FIG. 11, the R, G, and B values outputted from the color sensor 42 are converted into an XYZ color system by using a matrix operation in steps S22 and S23, similar to steps S12 and S13 of FIG. 6 according to the first embodiment. The X, Y, and Z values are converted into an L*a*b* color system, and chromaticity detection information by the color sensor 42 is separated into lightness information (L*) and hue information (a* and b*). In this case, the R, G, and B outputs from the color sensor 42 are converted into an XYZ color system, and then into an L*a*b* color system in an order of steps S22 and S23. Alternatively, sensor-specific R, G, and B outputs may be directly converted into an L*a*b* color system by learning using a neural net.

In steps S24 to S26, similar to steps S14 to S16 in the first embodiment, K single-color chromaticity characteristics (910 in FIG. 9) for all tonality data are calculated from L*a*b* values calculated from the K single-color patches (0-7), (1-7), . . . , (7-7).

In step S25, K single-color tonality data K0', K1', . . . , K7' which exhibit the same lightnesses as the lightnesses (LK0, LK1, . . . LK7) of the K reference values K0, K1, . . . , K7 saved in the memory of the image forming apparatus in advance are obtained among the target chromaticity characteristics for all tonality data calculated in step S24. In step S26, chromaticity characteristics (1002 and 1003) are searched for the hues a* and b* for the tonality data K0', K1', . . . K7'. These chromaticities (L0,aK0',bK0'), (L1,aK1',bK1'), . . . , (L7,aK7',bK7') are defined as the target chromaticities of colors generated by CMY color mixture for tonality data formed from C, M, and Y.

In step S27, similar to step S17 of the first embodiment, a black density correction table is created and stored in a memory 313. In step S28, C, M, and Y values (tonalities) at which the eight target chromaticities (L0,aK0',bK0'), (L1, aK1',bK1'), (L7,aK7',bK7') that are calculated in step S26 and have different tonality data become equal to the chromaticities of images formed by CMY color mixture are calculated by the same method as that in the first embodiment. More specifically, calculation described in the first embodiment is also executed for the first to seventh sets, and (CN',MN',YN', KN') are obtained for reference values (CN,MN,YN,KN) (N=1,2, . . . , 7).

Figure 14:
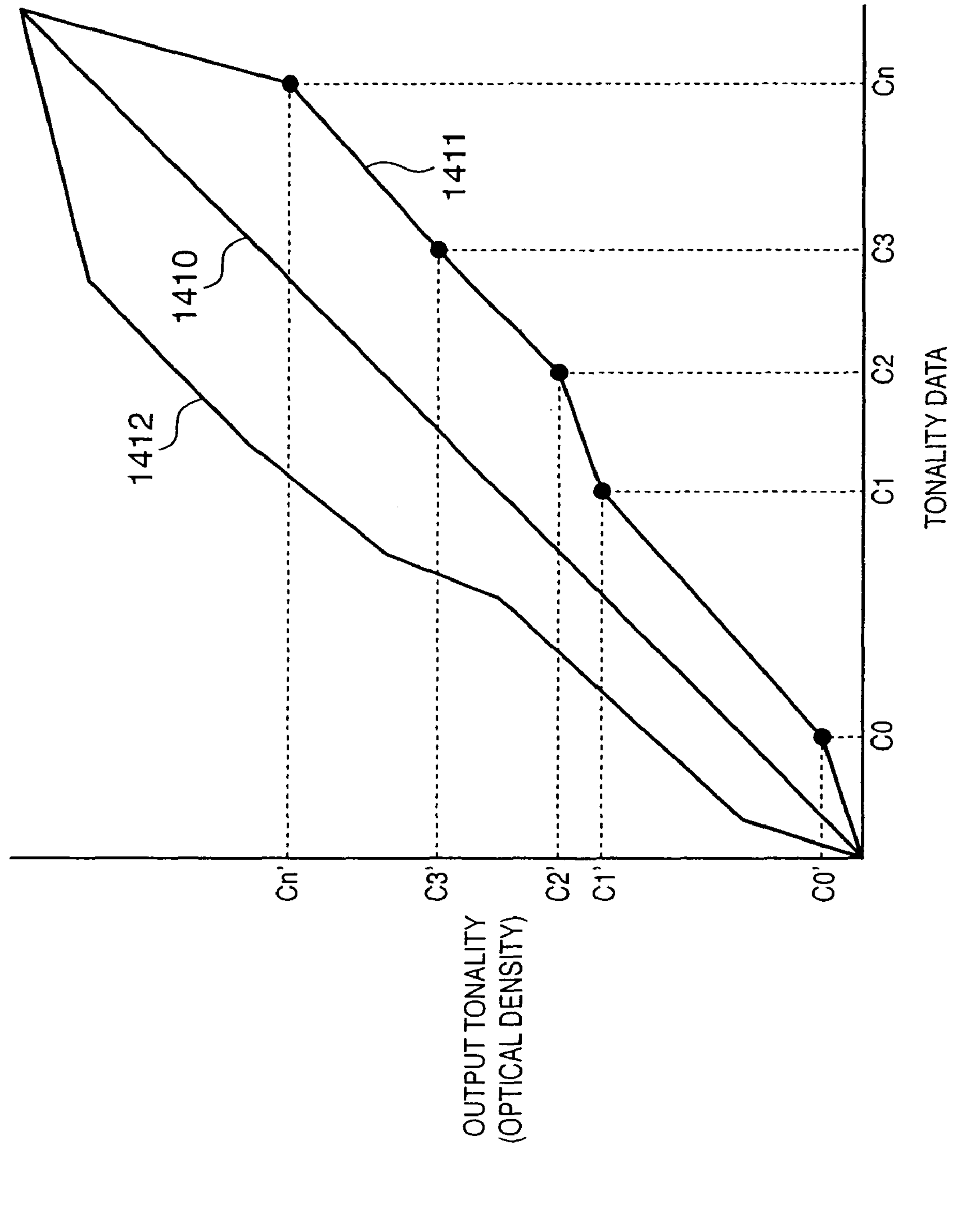
FIG. 14 is a graph showing the result of calculating cyan tonality data and the characteristics of a cyan density correction table when cyan attains predetermined density characteristics to tonality.

FIG. 14 is a graph exemplifying the result of calculating cyan tonality data and a characteristic 1410 of a cyan density correction table when cyan attains predetermined density characteristics to tonality.

The abscissa represents tonality data, and the ordinate represents the output tonality (optical density) of a sensor. The relationship between (CN,MN,YN) and (CN',MN',YN') calculated in the second embodiment is represented by full circles.

In step S27 of FIG. 11, the input/output relationship of tonality data represented by a line 1411 is calculated by, e.g., linear interpolation. Data of a characteristic 1412 inverse to the input/output characteristic of tonality data given by the line 1411 is calculated on the basis of the characteristic 1410 of the tonality-to-density correction table when predetermined density characteristics to tonality are attained. The characteristic data 1412 is stored in the memory 313 as a cyan density correction table for input image data, thereby always obtaining desired density characteristics to tonality.

Similar density correction tables are created for M and Y, and stored in the memory 313. Note that the value (CN,MN, YN,KN) is selected mainly from highlights by keeping it mind that "the human eye is sensitive to gray at the highlight and insensitive to the shadow" and "a UCR process (process of replacing part of C, M, and Y with K in color separation) is generally performed in a color process, and gray of only three colors C, M, and Y does not appear in the shadow region".

As described above, according to the second embodiment, a plurality of sets of mixed-color patch patterns having different K, C, M, and Y reference values are formed on the transfer material 11, and the chromaticities are detected by the color sensor 42. First, tonality data for obtaining a predetermined K single-color lightness is obtained, and the correction table of K single-color density characteristics to tonality for all tonality data is created by interpolation calculation. Then, the mixture rates of C, M, and Y which form CMY-mixed gray are calculated for a plurality of target chromaticities, and a density correction table for all tonality data is calculated by interpolation calculation.

With this process, the density characteristics to tonality of all the four colors C, M, Y, and K for forming a color image can be adjusted to desired states without performing density control based on density detection by the density sensor 41. At the same time, the second embodiment can provide a color image forming apparatus excellent in the stability of color forming even upon variations in the lightness component of a K single-color patch.

Other Embodiment

The present invention may be applied to a system including a plurality of devices (e.g., a host computer, interface device, reader, and printer) or an apparatus (e.g., a copying machine or facsimile apparatus) formed by a single device.

The object of the present invention is also achieved when a storage medium (or recording medium) which stores software program codes for realizing the functions of the above-described embodiments is supplied to a system or apparatus, and the computer (or the CPU or MPU) of the system or apparatus reads out and executes the program codes stored in the storage medium. In this case, the program codes read out from the storage medium realize the functions of the above-described embodiments, and the storage medium which stores the program codes constitutes the present invention. The functions of the above-described embodiments are realized when the computer executes the readout program codes. Also, the functions of the above-described embodiments are realized when an OS (Operating System) or the like running on the computer performs some or all of actual processes on the basis of the instructions of the program codes.

Furthermore, the present invention includes a case in which, after the program codes read out from the storage medium are written in the memory of a function expansion card inserted into the computer or the memory of a function expansion unit connected to the computer, the CPU of the function expansion card or function expansion unit performs some or all of actual processes on the basis of the instructions of the program codes and thereby realizes the functions of the above-described embodiments.

The present invention is not limited to the above embodiment, and various changes and modifications can be made thereto within the spirit and scope of the present invention. Therefore, to apprise the public of the scope of the present invention, the following claims are made.

CLAIM OF PRIORITY

This application claims priority from Japanese Patent Application No. 2004-139095 filed on May 7, 2004, the entire contents of which are hereby incorporated by reference herein.

What is claimed is:

1. A color image forming apparatus for forming a color image on a recording medium by using a plurality of coloring materials including at least a black coloring material and having a density sensing unit for detecting a density of an unfixed test image, comprising:

a test image forming unit configured to form one time, on a recording medium, both a plurality of first test images, each having different tonality of the black coloring material, and a plurality of second test images of a mixture of cyan, magenta and yellow coloring materials, each having a reference tonality, each second test image corresponding to one of the plurality of first test images, and to fix both the first test images and the second test images on the recording medium;

a color sensing unit configured to detect, respectively, color values of the first test images and the second test images, which are formed one time and fixed on the recording medium by the test image forming unit, wherein the color values of the first test images comprise lightness values and hue values;

a first acquisition unit configured to acquire tonality data of black corresponding to a tonality of each of the first test images based on the lightness values of the color values of the first test images detected by the color sensing unit, wherein the tonality data of black acquired by the first acquisition unit corresponds to a target lightness based on an estimated lightness line defined by the tonality data of the black coloring material used for the first test images and the lightness values of the color values of the first test images detected by the color sensing unit;

a second acquisition unit configured to acquire target hue values based on an estimated hue line defined by the tonality data of the black coloring material used for the first test images and the hue values of the color values of the first test images detected by the color sensing unit; and a calculation unit configured to set the target lightness and the target hue values as target color values, and to calculate tonality data of the cyan, magenta and yellow coloring materials on the basis of the target color values and the color values of the second test images detected by the color sensing unit, wherein the target color values are based on the same first test images which are formed one time by the test image forming unit.

2. The apparatus according to claim 1, wherein the color sensing unit has a plurality of light emitting devices having different emission spectra and a light sensor, and detects the color values of the first test images and the second test images by processing signals corresponding to a plurality of colors detected by the light sensor.

3. The apparatus according to claim 1, wherein the color sensing unit has a light emitting device and a plurality of light sensors having different spectral sensitivities, and detects the color values of the first test images and the second test images by processing signals corresponding to a plurality of colors detected by the plurality of light sensors.

4. A method of controlling a color image forming apparatus for forming a color image on a recording medium by using a plurality of coloring materials including at least a black coloring material and having a density sensing unit for detecting a density of an unfixed test image, comprising:

a test image forming step of forming one time, on a recording medium, both a plurality of first test images, each having different tonality of the black coloring material, and a plurality of second test images of a mixture of cyan, magenta and yellow coloring materials, each having a reference tonality, each second test image corresponding to one of the plurality of first test images, and of fixing both the first test images and the second test images on the recording medium;

a detection step of respectively detecting, using a color sensing unit, color values of the first test images and the second test images, which are formed one time and fixed on the recording medium in the test image forming step, the color values of the first test images comprise lightness values and hue values;

a first acquisition step of acquiring tonality data of black corresponding to a tonality of each of the first test images based on the lightness values of the color values of the first test images detected by the color sensing unit, in the detection step, wherein the tonality data of black acquired in the first acquisition step corresponds to a target lightness based on an estimated lightness line defined by the tonality data of the black coloring material used for the first test images and the lightness values of the color values of the first test images detected in the detection step;

a second acquisition step of acquiring target hue values based on an estimated hue line defined by the tonality data of the black coloring material used for the first test images and the hue values of the color values of the first test images detected in the detecting step; and a calculation step of setting the target lightness and the target hue values as target color values, and of calculating tonality data of the cyan, magenta and yellow coloring materials based on the target color values and the color values of the second test images detected in the detection step, wherein the target color values are based on the same first test images which are formed one time in the test image forming step.

5. The method according to claim 4, wherein the detection step uses the color sensing unit comprising a plurality of light emitting devices having different emission spectra and a light sensor, and the color values of the first test images and the second test images are detected by processing signals corresponding to a plurality of colors detected by the light sensor.

6. The method according to claim 4, wherein the detection step uses the color sensing unit comprising a light emitting device and a plurality of light sensors having different spectral sensitivities, and the color values of the first test images and the second test images are detected by processing signals corresponding to a plurality of colors detected by the plurality of light sensors.

7. The apparatus according to claim 1, further comprising a correction unit configured to correct input-output characteristics of black tonality based on tonality data of each of the first test images of the black coloring material and the tonality data of black acquired by the acquisition unit.

8. The method according to claim 4, further comprising a correction step of correcting input-output characteristics of black tonality based on tonality data of each of the first test images of the black coloring material and the tonality data of black acquired in the acquisition step.

* * * * *